(12) United States Patent
Nishino

(10) Patent No.: US 8,525,039 B2
(45) Date of Patent: Sep. 3, 2013

(54) PHOTOSENSITIVE GLASS PASTE AND MULTILAYER WIRING CHIP COMPONENT

(75) Inventor: Kosuke Nishino, Ritto (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 1069 days.

(21) Appl. No.: 12/533,538

(22) Filed: Jul. 31, 2009

(65) Prior Publication Data

US 2009/0283306 A1 Nov. 19, 2009

Related U.S. Application Data

(63) Continuation of application No. PCT/JP2008/051292, filed on Jan. 29, 2008.

(30) Foreign Application Priority Data

Jan. 30, 2007 (JP) ................................. 2007-019560

(51) Int. Cl.
*H05K 1/09* (2006.01)
*C03C 3/089* (2006.01)

(52) U.S. Cl.
USPC .............. 174/257; 257/634; 257/650; 501/55

(58) Field of Classification Search
USPC .................... 174/257; 257/634, 650; 501/55
See application file for complete search history.

(56) References Cited

U.S. PATENT DOCUMENTS

| | | | | |
|---|---|---|---|---|
| 6,117,614 | A * | 9/2000 | Takahashi et al. | 430/270.1 |
| 6,183,669 | B1 * | 2/2001 | Kubota et al. | 156/89.16 |
| 6,365,265 | B1 * | 4/2002 | Tose et al. | 428/210 |
| 6,455,453 | B1 | 9/2002 | Chikagawa | |
| 7,146,719 | B2 * | 12/2006 | Iha | 29/830 |
| 2001/0014429 | A1 | 8/2001 | Iha | |
| 2002/0001881 | A1 * | 1/2002 | Kosokabe | 438/127 |
| 2003/0203317 | A1 * | 10/2003 | Iha | 430/311 |

FOREIGN PATENT DOCUMENTS

| | | |
|---|---|---|
| JP | 3150141 A | 6/1991 |
| JP | 08-018236 A | 1/1996 |
| JP | 10-087342 A | 4/1998 |
| JP | 10-289822 A | 10/1998 |
| JP | 11-204336 A | 7/1999 |
| JP | 2000-275826 A | 10/2000 |
| JP | 2001-114554 A | 4/2001 |
| JP | 2001-210141 A | 8/2001 |
| JP | 2002-037641 A | 2/2002 |
| JP | 2003-104755 A | 4/2003 |

OTHER PUBLICATIONS

International Search Report issued for International Application PCT/JP2008/051292 dated Mar. 18, 2008.

* cited by examiner

*Primary Examiner* — William H Mayo, III
*Assistant Examiner* — Hiram E Gonzalez
(74) *Attorney, Agent, or Firm* — Dickstein Shapiro LLP

(57) ABSTRACT

A photosensitive glass paste that can be fired at a low temperature for a short period of time and that can suppress generation of voids and diffusion of Ag in glass layers formed by firing, and a high-performance multilayer wiring chip component manufactured by using the above photosensitive glass paste are provided. As a sintering aid glass which is combined with a ceramic aggregate and a primary glass, a glass having a contact angle to the ceramic aggregate smaller than that of the primary glass to the ceramic aggregate is used, and the content of the sintering aid glass is set to 5 to 10 percent by volume of the inorganic component. As the sintering aid glass, a glass containing $SiO_2$, $B_2O_3$, CaO, $Li_2O$, and ZnO at a predetermined ratio is preferably used. As the primary glass, a glass containing 70 to 90 percent by weight of $SiO_2$, 15 to 20 percent by weight of $B_2O_3$, and 1 to 5 percent by weight of $K_2O$ can be used.

20 Claims, 2 Drawing Sheets

US 8,525,039 B2

PHOTOSENSITIVE GLASS PASTE AND MULTILAYER WIRING CHIP COMPONENT

This is a continuation of application Ser. No. PCT/JP2008/051292, filed Jan. 29, 2008, the contents of which is hereby incorporated by reference.

TECHNICAL FIELD

The present invention relates to a photosensitive glass paste and a multilayer wiring chip component that includes glass layers and conductor layers formed therebetween using a photosensitive Ag paste, the glass layers being formed using the photosensitive glass paste.

BACKGROUND ART

As a non-magnetic ceramic material used for manufacturing a ceramic multilayer component having an inductor portion that uses a non-magnetic ceramic including a borosilicate glass, a non-magnetic ceramic that includes a borosilicate glass containing 70 to 90 percent by weight of $SiO_2$, 10 to 30 percent by weight of $B_2O_3$, and 5 percent by weight or less of $K_2O$ is known (see Patent Document 1).

Since the dielectric constant of a non-magnetic ceramic layer of the inductor portion is extremely low when this non-magnetic ceramic is used, as compared to that of a ferrite magnetic layer, it has been believed that a self-resonant frequency can be significantly increased, the inductor portion is easily applied to a high frequency region, and the degree of freedom of structural designing of ceramic multilayer components can be improved.

As a method for manufacturing a multilayer ceramic circuit board using a photosensitive material, a method for manufacturing a multilayer ceramic circuit board in which a photosensitive ceramic paste and a photosensitive conductive paste are sequentially processed by exposure, development, and lamination is known (see Patent Document 2).

According to this manufacturing method, it has been believed that a multilayer ceramic circuit board having a high wire density can be efficiently manufactured.

A glass containing $SiO_2$, $B_2O_3$, and $K_2O$ (hereinafter also referred to as "Si—B—K-based glass"), which is usable according to Patent Document 1, has low viscous fluidity during firing. Accordingly, for example, when firing a laminate of glass layers containing this Si—B—K-based glass and conductor layers containing Ag as a conductive component laminated thereto, degradation in insulating properties between the layers caused by diffusion of the conductive Ag into the glass layers (insulating layers) can be suppressed or prevented; hence, the glass described above is a preferable material for that reason.

However, since a Si—B—K-based glass has inferior wettability to a ceramic aggregate, such as alumina, which is included in a glass paste as a filler (for example, a contact angle: 90° or more), a long firing treatment must be performed in order to obtain a dense glass layer (insulating member).

As the firing time is increased, voids are generated in a sintered body (sintered laminate of a multilayer wiring chip component or the like) and/or Ag is diffused, so that the insulating properties between the layers are disadvantageously degraded.

Also in the case in which a conventional photosensitive glass paste is used that includes, a glass other than a Si—B—K-based glass as disclosed in the above Patent Documents 1 and 2, a problem similar to that described above actually occurs to greater or lesser degrees.

Patent Document 1: Japanese Unexamined Patent Application Publication No. 10-87342

Patent Document 2: Japanese Unexamined Patent Application Publication No. 8-18236

DISCLOSURE OF INVENTION

Problems to be Solved by the Invention

The present invention has been conceived to solve the problems described above, and an object of the present invention is to provide a photosensitive glass paste that can be fired at a low temperature for a short period of time and that can suppress generation of voids and diffusion of Ag into glass layers formed by firing and a high-performance multilayer wiring chip component manufactured using the above photosensitive glass paste.

Means for Solving the Problems

To this end, a photosensitive glass paste according to the present invention that is used to form glass layers by firing when a multilayer wiring chip component is manufactured that includes the glass layers and at least one conductor layer formed therebetween by firing a photosensitive Ag paste, comprises:

an inorganic component including a primary glass, a sintering aid glass, and a ceramic aggregate; and a photosensitive organic component, wherein the softening point of the sintering aid glass is 600° C. or more, the content ratio of the sintering aid glass in the inorganic component is 5 to 10 percent by volume and the contact angle of the sintering aid glass to the ceramic aggregate at 800° C. is smaller than that of the primary glass to the ceramic aggregate at 800° C.

The primary glass preferably contains 70 to 90 percent by weight of $SiO_2$, 15 to 20 percent by weight of $B_2O_3$, and 1 to 5 percent by weight of $K_2O$.

In the photosensitive glass paste, the sintering aid glass preferably contains 45 to 60 percent by weight of $SiO_2$, 15 to 25 percent by weight of $B_2O_3$, 10 to 20 percent by weight of CaO, 5 to 15 percent by weight of $Li_2O$, and 0 to 10 percent by weight of ZnO.

The ceramic aggregate preferably contains at least one selected from the group consisting of alumina, magnesia, spinel, silica, forsterite, steatite, and zirconia, and the content of the ceramic aggregate in the inorganic component is 22.5 to 27.5 percent by volume.

The photosensitive glass paste can further comprise an organic dye as an ultraviolet absorber.

The photosensitive glass paste can further comprise a phosphorous-based compound as a photopolymerization initiator.

The phosphorous-based compound functioning as the photopolymerization initiator can be at least one selected from the group consisting of bis(2,4,6-trimethylbenzoyl)-phenylphosphine oxide, 2,4,6-trimethylbenzoyl diphenylphosphine oxide, bis(2,6-dimethoxybenzoyl)-2,4,4-trimethylpentylphosphine oxide, bis(2,6-dichlorobenzoyl)-4-propylbenzylphosphine oxide, 2,4,6-trimethylbenzoyl diphenylphosphinate, and (2,6-dimethoxybenzoyl)-2,4,4-pentylphosphine oxide.

A multilayer wiring chip component comprises: glass layers formed by firing the photosensitive glass paste and at least one conductor layer formed between the glass layers by performing a heat treatment on the photosensitive Ag paste.

Advantages

The photosensitive glass paste of the present invention has an inorganic component including a primary glass, a sintering aid glass, and a ceramic aggregate and a photosensitive organic component, a glass having a contact angle with the ceramic aggregate at 800° C. smaller than that of the primary glass with the ceramic aggregate at 800° C. and a softening point of 600° C. or more is used as the sintering aid glass, and the content ratio thereof in the inorganic component is set to 5 to 10 percent by volume of the inorganic component; hence, low-temperature and short-time sintering can be carried out, and generation of voids and diffusion of Ag in glass layers formed by a firing step can be suppressed.

That is, since a glass component is used containing the primary glass and the sintering aid glass that has wettability to the ceramic aggregate which is superior to that of the primary glass, diffusion of Ag can be suppressed, and in addition, low-temperature and short-time sintering can be carried out; hence, generation of voids and diffusion of Ag caused by long-time firing can be suppressed.

When a sintering aid glass having a softening point of 600° C. or more is used, most organic materials, such as a binder, can be efficiently removed by a debindering step generally performed in the range of 500 to 600° C.; hence, in a subsequent firing, generation of voids caused by oxidation of carbon that remains when the glass component is softened can be efficiently suppressed or prevented.

By using the photosensitive glass paste of the present invention, when a multilayer wiring chip component, such as a multilayer inductor, having a structure in which conductor layers are provided between glass layers is manufactured, a highly reliable multilayer wiring chip component having superior interlayer insulating properties and desired properties can be efficiently manufactured.

In addition, since low-temperature and short-time firing can be performed by using the photosensitive glass paste of the present invention, glass layers (insulating layers) can be reliably formed in which via holes each having a predetermined shape and dimensional accuracy are disposed at predetermined positions.

The "contact angle with the ceramic aggregate at 800° C." of the present invention is a contact angle measured at 800° C. with a ceramic substrate formed by molding and firing the same material (material having the same conditions, such as composition and particle diameters) as the ceramic aggregate, and this ceramic substrate is not a constituent element forming the multilayer wiring chip component of the present invention but is a concept introduced to define the wettability of the sintering aid glass to the ceramic aggregate.

In addition, since a glass used as the primary glass contains 70 to 90 percent by weight of $SiO_2$, 15 to 20 percent by weight of $B_2O_3$, and 1 to 5 percent by weight of $K_2O$ has low viscous fluidity, diffusion of Ag to glass layers formed by firing can be efficiently suppressed. Hence, a glass layer (insulating layer) having high insulating properties can be formed by using the photosensitive glass paste of the present invention.

In addition, since a glass used as the sintering aid glass and containing 45 to 60 percent by weight of $SiO_2$, 15 to 25 percent by weight of $B_2O_3$, 10 to 20 percent by weight of CaO, 5 to 15 percent by weight of $Li_2O$, and 0 to 10 percent by weight of ZnO has a high wettability to the ceramic aggregate, low-temperature and short-time firing can be performed, and generation of voids and diffusion of Ag can be more reliably suppressed or prevented, so that the effects of the present invention can be realized.

When at least one selected from the group consisting of alumina, magnesia, spinel, silica, forsterite, steatite, and zirconia is contained as the ceramic aggregate in the inorganic component at a ratio of 22.5 to 27.5 percent by volume, a glass layer having a flexural strength of 160 MPa or more can be formed, and in addition, the necessary shape preservation ability can be realized, so that a multilayer structure (multilayer wiring chip component) having superior shape and dimensional accuracy can be obtained.

The content of the ceramic aggregate in the inorganic component is preferably 22.5 to 27.5 percent by volume when the inorganic component is 100 percent by volume. The reasons for this are that when the content of the ceramic aggregate is less than 22.5 percent by volume, the flexural strength of the glass layer cannot achieve 160 MPa, and the reliability in terms of strength becomes insufficient, and when the content is more than 27.5 percent by volume, the sintering properties are degraded.

When an organic dye is contained as an ultraviolet absorber, formation of via holes having a high accuracy can be performed by a photolithography method or the like. Hence, for example, when via holes are formed, the holes having superior shape and dimensional accuracy can be reliably formed, and a multilayer wiring chip component having high performance and high reliability can be manufactured.

By containing a phosphorous-based compound as a photopolymerization initiator, polymerization of a photosensitive organic compound can be reliably started when via holes are formed by a photolithography method or the like, and via holes having superior shape and dimensional accuracy can be reliably formed, so that a multilayer wiring chip component having high performance and high reliability can be manufactured.

When at least one member selected from the group consisting of bis(2,4,6-trimethylbenzoyl)-phenylphosphine oxide, 2,4,6-trimethylbenzoyl diphenylphosphine oxide, bis (2,6-dimethoxybenzoyl)-2,4,4-trimethylpentylphosphine oxide, bis(2,6-dichlorobenzoyl)-4-propylbenzylphosphine oxide, 2,4,6-trimethylbenzoyl diphenylphosphinate, and (2,6-dimethoxybenzoyl)-2,4,4-pentylphosphine oxide is used as a phosphorous-based compound functioning as a photopolymerization initiator, polymerization of a photosensitive organic compound can be reliably started, and the effects of the present invention can be more efficiently realized.

Since the multilayer wiring chip component of the present invention includes glass layers formed by firing the photosensitive glass of the present invention and at least one conductor layer formed by performing a heat treatment on the photosensitive Ag paste, and the photosensitive glass paste of the present invention has the above-described properties, a highly reliable multilayer wiring chip component including the glass layers, the at least one conductor layer provided therebetween, and the like can be provided, the glass layers being provided with via holes having predetermined shape and dimensional accuracy at predetermined positions.

Figure 1:
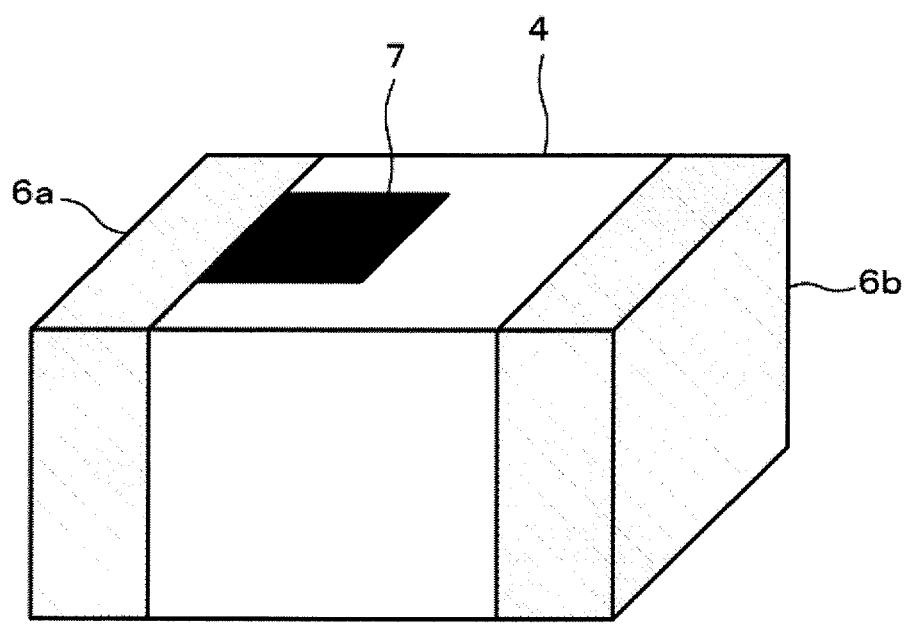
FIG. 1 is a perspective view showing an external structure of a multilayer wiring chip component (multilayer inductor) according to one embodiment of the present invention.

| Reference Numerals | |
| --- | --- |
| 1 | glass layer (insulating layer) |
| 2 | conductor layer (internal conductor) |
| 3 | via hole |
| 4 | laminate |
| 5 | coil |
| 5a, 5b | end portion of coil |
| 6a, 6b | external electrode |
| 7 | direction mark pattern |

BEST MODES FOR CARRYING OUT THE INVENTION

In a photosensitive glass paste of the present invention, as a primary glass, for example, a Si—B—K-based glass containing, for example, 70 to 90 percent by weight of $SiO_2$, 15 to 20 percent by weight of $B_2O_3$, and 1 to 5 percent by weight of $K_2O$ is preferably used. When this Si—B—K-based glass is used as the primary glass, Ag diffusion can be sufficiently prevented since viscous fluidity is low. In addition, when the Si—B—K-based glass is used, the preferable average particle diameter is in the range of 0.8 to 1.3 μm.

As a sintering aid glass, for example, a glass containing 45 to 60 percent by weight of $SiO_2$, 15 to 25 percent by weight of $B_2O_3$, 10 to 20 percent by weight of CaO, 5 to 15 percent by weight of $Li_2O$, and 0 to 10 percent by weight of ZnO is preferably used in terms of its wettability. When this sintering aid glass is used, a preferable average particle diameter is in the range of 2.3 to 2.7 μm.

As an ultraviolet absorber, an organic dye having a high UV absorbance in a wavelength range of 350 to 450 nm is preferably used. Even if added as an absorber, an organic dye evaporates during firing and does not remain in glass layers thereafter, so that the insulating resistance is preferably not degraded by the absorber.

As the organic dye, various dyes having a high absorbance may be used, and in particular, as preferable organic dyes, for example, an azo-based dye, an aminoketone-based dye, a xanthene-based dye, a quinoline-based dye, and an anthraquinone-based dye may be mentioned. Among those mentioned above, in particular, an azo-based dye is preferably used.

As an representative azo-based dye, for example, Sudan Blue ($C_{22}H_{18}N_2O_2$=342.4), Sudan R ($C_{17}H_{14}N_2O_2$=278.31), Sudan II ($C_{18}Hl_4N_2O$=276.34), Sudan III ($C_{22}H_{16}N_4O$=352.4), Sudan IV ($C_{24}H_{20}N_4O$=380.45), Oil Orange SS ($CH_3C_6H_4N:NC_{10}H_6OH$=262.31), Oil Violet ($C_{24}H_{21}N_5$=379.46), or Oil Yellow OB ($CH_3C_4H_4N:NC_{10}H_4NH_2$=261.33) may be mentioned, and an organic dye having a high UV absorbance in a wavelength range of 250 to 520 nm is preferably used.

As a ceramic aggregate, alumina, magnesia, spinel, silica, forsterite, steatite, or zirconia may be used, and two or more may also be used in combination.

In addition, among the ceramic aggregates mentioned above, alumina is preferably used as the ceramic aggregate in terms of the strength of a glass layer (insulating layer) and the laminate to be formed, in particular.

EXAMPLE 1

Hereinafter, features of the present invention will be further described in detail with reference to examples of the present invention.

[Formation of Photosensitive Glass Paste]

As shown in Table 1, (a) as a primary glass, a borosilicate glass (Si—B—K-based glass) (glass A, contact angle to alumina at 800° C.: ≧90°, glass softening point Ts: 790° C.) containing $SiO_2$, $B_2O_3$, and $K_2O$ at a predetermined ratio was prepared.

(b) As a sintering aid glass, a Si—B—Li—Ca—Zn-based borosilicate glass (glass B, contact angle to alumina at 800° C.: 26°, glass softening point Ts: 718° C.) containing $SiO_2$, $B_2O_3$, $Li_2O$, CaO, and ZnO at a predetermined ratio was prepared.

(c) As a sintering aid glass, a Si—B—Li—Ca—Zn-based borosilicate glass (glass C, contact angle to alumina at 800° C.: 44°, glass softening point Ts: 609° C.) containing $SiO_2$, $B_2O_3$, $Li_2O$, CaO, and ZnO at a predetermined ratio was prepared.

Glasses (b) and (c) were glasses that satisfied requirements for a sintering aid glass used in the present invention.

Furthermore, for the comparison purpose, the following glasses (d) and (e) were each prepared as a sintering aid glass having a different contact angle to alumina at 800° C. and a different softening point. Glasses (d) and (e) do not satisfy requirements for the sintering aid glass used in the present invention. (d) A Bi—B—Li—Si-based borosilicate glass (glass D, contact angle to alumina at 800° C.: 10°, glass softening point Ts: 420° C.) containing $Bi_2O_3$: $B_2O_3$: $Li_2O$: $SiO_2$ at a predetermined ratio was prepared.

(e) A Bi—B—Al—Si-based borosilicate glass (glass E, contact angle to alumina at 800° C.: 10°, glass softening point Ts: 490° C.) containing $Bi_2O_3$: $B_2O_3$: $Al_2O_3$: $SiO_2$ at a predetermined ratio was prepared.

TABLE 1

| COMPOSITION COMPONENT OF GLASS (MIXING RATIO: PERCENT BY WEIGHT) | CONTACT ANGLE AT 800° C. | GLASS SOFTENING POINT (Ts) |
|---|---|---|
| GLASS A (PRIMARY GLASS): AVERAGE PARTICLE DIAMETER 1.0 μm ($Sio_2$:$B_2O_3$:$K_2O$ = 79:19:2) | ≧90° C. | 790° C. |
| GLASS B (SINTERING AID GLASS): AVERAGE PARTICLE DIAMETER 2.5 μm ($SiO_2$:$B_2O_3$:$Li_2O$:CaO:ZnO = 50.6:21.4:10.2:12.7:5.1) | 26° | 718° C. |
| GLASS C (SINTERING AID GLASS): AVERAGE PARTICLE DIAMETER 2.5 μm ($SiO_2$:$B_2O_3$:$Li_2O$:CaO:ZnO = 50.6:21.3:10.3:12.7:5.1) | 44° | 609° C. |
| GLASS D (SINTERING AID GLASS): AVERAGE PARTICLE DIAMETER 2.5 μm ($Bi_2O_3$:$B_2O_3$:$Li_2O$:$SiO_2$ = 89.8:3.1:0.9:6.2) | 10° | 420° C. |
| GLASS E (SINTERING AID GLASS): AVERAGE PARTICLE DIAMETER 2.5 μm ($Bi_2O_3$:$B_2O_3$:$Al_2O_3$:$SiO_2$ = 73.7:22.2:0.9:3.2) | 10° | 490° C. |

In Table 1, the contact angle of each glass at 800° C. to an alumina substrate and the softening point of each glass are shown. An alumina substrate was obtained by molding and firing a selected glass and an alumina powder.

The primary glass (glass A) and the sintering aid glasses (glasses B, C, D, and E) shown in Table 1 were mixed together at ratios shown in Table 2, so that inorganic components (mixtures each containing the primary glass, the sintering aid glass, and the ceramic aggregate (filler)) were prepared.

TABLE 2

| | TYPE OF SINTERING AID GLASS | AMOUNT OF SINTERING AID GLASS (PERCENT BY VOLUME) | AMOUNT OF PRIMARY GLASS (GLASS A) (PERCENT BY VOLUME) | AMOUNT OF FILLER (CERAMIC AGGREGATE) (PERCENT BY VOLUME) |
|---|---|---|---|---|
| INORGANIC COMPONENT 1 (EXAMPLE) | GLASS B | 8 | 67 | 25 |
| INORGANIC COMPONENT 2 (EXAMPLE) | GLASS B | 7 | 68 | 25 |
| INORGANIC COMPONENT 3 (EXAMPLE) | GLASS B | 10 | 65 | 25 |
| INORGANIC COMPONENT 4 (EXAMPLE) | GLASS C | 5 | 70 | 25 |
| INORGANIC COMPONENT 5 (EXAMPLE) | GLASS C | 10 | 65 | 25 |
| INORGANIC COMPONENT 6 (COMPARATIVE EXAMPLE) | GLASS B | 4 | 71 | 25 |
| INORGANIC COMPONENT 7 (COMPARATIVE EXAMPLE) | GLASS B | 15 | 60 | 25 |
| INORGANIC COMPONENT 8 (COMPARATIVE EXAMPLE) | GLASS D | 10 | 65 | 25 |
| INORGANIC COMPONENT 9 (COMPARATIVE EXAMPLE) | GLASS E | 10 | 65 | 25 |

In Table 2, Inorganic Components 1 to 5 are inorganic components within the range of the present invention, and Inorganic Components 6 to 9 are inorganic components of Comparative Examples which are out of the present invention.

Subsequently, each inorganic component shown in Table 2 and the following components were mixed together at the ratios shown below, so that a photosensitive glass paste was obtained.

(a) polymer (copolymer of acrylic acid and methyl acrylate: 28 parts by weight)

(b) monomer (EO modified trimethylol propane triacrylate: 12 parts by weight)

(c) photopolymerization initiator 1 (2-methyl-1[4-(methylthio)phenyl]-2-morpholino propane: 1 part by weight)

(d) photopolymerization initiator 2 (2,4-dimethyl thioxanthone: 0.4 parts by weight)

(e) photopolymerization initiator 3 (bis(2,4,6-trimethylbenzoyl)-phenylphosphine oxide: 0.6 parts by weight)

(f) solvent (pentamethylene glycol: 0.6 parts by weight)

(g) organic dye (Oil Yellow (trade name, manufactured by Orient Chemical Industries, Ltd.): 1 part by weight)

(h) additive (dispersant, defoamant: 1 part by weight)

(i) inorganic mixture shown in Table 2 (55.4 parts by weight)

[Formation of Test Circuit Chip]

Next, a test circuit chip was formed in accordance with the following procedure using the above photosensitive glass paste.

(1) First, after the photosensitive glass paste is screen-printed on a PET film and is then dried, one entire surface thereof is exposed. The above process is repeated several times, so that a glass layer having a thickness of approximately 150 μm is formed as an external layer.

(2) Next, a photosensitive Ag paste is screen-printed on the external layer so as to have a thickness of approximately 10 μm, followed by drying.

(3) Subsequently, a photosensitive Ag paste layer is processed by exposure and a development treatment to form a first-layer coil pattern.

(4) The photosensitive glass paste is screen-printed on the entire surface of the coil pattern thus formed so as to have a thickness of approximately 15 μm, followed by drying. Subsequently, an exposure/development treatment is selectively performed to form via holes at predetermined positions.

(5) The photosensitive Ag paste is again screen-printed on the entire surface to have a thickness of approximately 10 μm, followed by drying.

(6) Next, the photosensitive Ag paste is selectively processed by an exposure/development treatment to form a second-layer coil pattern.

(7) Furthermore, the entire-surface printing of the photosensitive glass paste, drying, and entire-surface exposure are repeated as necessary to form an external layer.

As a result, a mother circuit board was obtained in which two conductor layers (electrode layers) were provided inside and external layers were provided at the top and the bottom sides. After this circuit board was divided using a dicer into chips having a size of approximately 1 mm square, the PET film was removed, and debindering was performed. Subsequently, firing was performed, so that a test circuit chip (each of Samples 1 to 9) was obtained that had the structure in which two conductor layers (electrode layers) were provided in the inside.

[Evaluation]

The Ag diffusion amount, sintering properties, and porosity of each test circuit chip that was formed using the above photosensitive glass paste and that included the two conductor layers were investigated. The results are shown in Table 3.

TABLE 3

| SAMPLE NO. | TYPE OF INORGANIC COMPONENT | Ag DIFFUSION AMOUNT | SINTERING PROPERTIES | POROSITY/% |
|---|---|---|---|---|
| 1 (EXAMPLE) | INORGANIC COMPONENT 1 | ○ | ○ | 0.3 |
| 2 (EXAMPLE) | INORGANIC COMPONENT 2 | ○ | ○ | 0.3 |
| 3 (EXAMPLE) | INORGANIC COMPONENT 3 | ○ | ○ | 0.7 |
| 4 (EXAMPLE) | INORGANIC COMPONENT 4 | ○ | ○ | 0.3 |
| 5 (EXAMPLE) | INORGANIC COMPONENT 5 | ○ | ○ | 0.7 |
| 6* (COMPARATIVE EXAMPLE) | INORGANIC COMPONENT 6 | ○ | X | 0.4 |
| 7* (COMPARATIVE EXAMPLE) | INORGANIC COMPONENT 7 | X | ○ | 4.4 |
| 8* (COMPARATIVE EXAMPLE) | INORGANIC COMPONENT 8 | X | ○ | 10.8 |
| 9* (COMPARATIVE EXAMPLE) | INORGANIC COMPONENT 9 | X | ○ | 18.8 |

In Table 3, a Sample No. provided with * indicates a Comparative Example out of the present invention.

In Table 3, a Ag diffusion amount of less than 30 μm was represented by ○, and a Ag diffusion amount of 30 μm or more was represented by x.

For evaluation of the sintering properties, a test circuit chip was immersed in a red dye ink and was then recovered, washing was performed, and the cross-sectional of the test circuit chip was polished. The sintering properties were represented by x when infiltration of ink into the inside was confirmed and were represented by ○ when infiltration was not confirmed.

For evaluation of the porosity (%), a visual field observed by a scanning laser microscope (1LM21, manufactured by Lasertec Corporation, magnification: 50 times) was downloaded into a personal computer, and the area of the glass portion and the area of the porosity portion were measured by light-dark binarization. In the present invention, the porosity is defined by the following equation.

Porosity=Area of porosity portion in observed glass layer/total area of observed glass layer It was confirmed that when the porosity was 1% or more, the defective fraction increased.

As shown in Table 3, it was confirmed that a circuit chip can be formed in which the Ag diffusion amount was small and sufficiently sintered glass layers (insulating layers) were provided in the case of Sample Nos. 1 to 5 that used the photosensitive glass pastes according to the examples of the present invention containing Inorganic Components 1 to 5 (inorganic components satisfied the requirements of the present invention) shown in Table 2. In addition, it was also confirmed that the porosity of the glass layers (insulating layers) forming the circuit chip was as small as less than 1.

On the other hand, it was confirmed that the sintering properties became insufficient in the case of Sample No. 6 in Table 3 that used the photosensitive glass paste containing Inorganic Component 6 (inorganic component out of the present invention in which the sintering aid glass (glass B) and the inorganic component was 4 percent by volume which was lower than the range of the present invention) shown in Table 2.

In addition, it was confirmed that as the Ag diffusion amount increased, the porosity also increased in the case of Sample of Sample No. 7 in Table 3 that used the photosensitive glass paste containing Inorganic Component 7 (inorganic compound out of the present invention in which the sintering aid glass (glass B) in the inorganic component was 15 percent by volume which was more than the range of the present invention) shown in Table 2.

According to the evaluation results of Sample Nos. 6 and 7, it was found that the amount of the sintering aid glass in the inorganic component had an influence on the sintering properties, Ag diffusion amount, and porosity, and that when the amount of the sintering aid glass was out of the range of the present invention, the sintering properties, Ag diffusion amount, and porosity are all unfavorably degraded.

In the case of Sample of Sample No. 8 in Table 3 that used the photosensitive glass paste containing Inorganic Component 8 (inorganic component out of the present invention that contained the glass D having a glass softening point of 420° C. as the sintering aid glass) shown in Table 2, it was confirmed that since the glass softening point of the glass D was less than 600° C. (420° C.), the porosity also increased as the Ag diffusion amount increased.

In the case of Sample of Sample No. 9 in Table 3 that used the photosensitive glass paste containing Inorganic Component 9 (inorganic component out of the present invention that contained the glass E having a glass softening point of 490° C. as the sintering aid glass) shown in Table 2, it was also confirmed that since the glass softening point of the glass E was less than 600° C. (490° C.), the porosity also increased as the Ag diffusion amount increased.

According to the evaluation results of Sample Nos. 8 and 9, it was found that when the glass softening point of the sintering aid glass was less than 600° C., although the sintering properties were superior, both the Ag diffusion amount and the porosity increased, so that superior properties could not be obtained.

The reason the porosity increases as believed to be that when the sintering aid glass used has a softening point lower than a heat treatment temperature (in general, 500 to 600° C.) in a debindering step performed before the firing step, the sintering aid glass starts to soften during the debindering step, residues of organic components and carbon that unavoidably remains in debindering are confined in a softened glass layer (insulating layer), and voids are formed by gases generated by oxidation of carbon in the subsequent firing step.

EXAMPLE 2

In this Example 2, a multilayer wiring chip component manufactured using a photosensitive glass paste of the present invention will be described.

Figure 2:
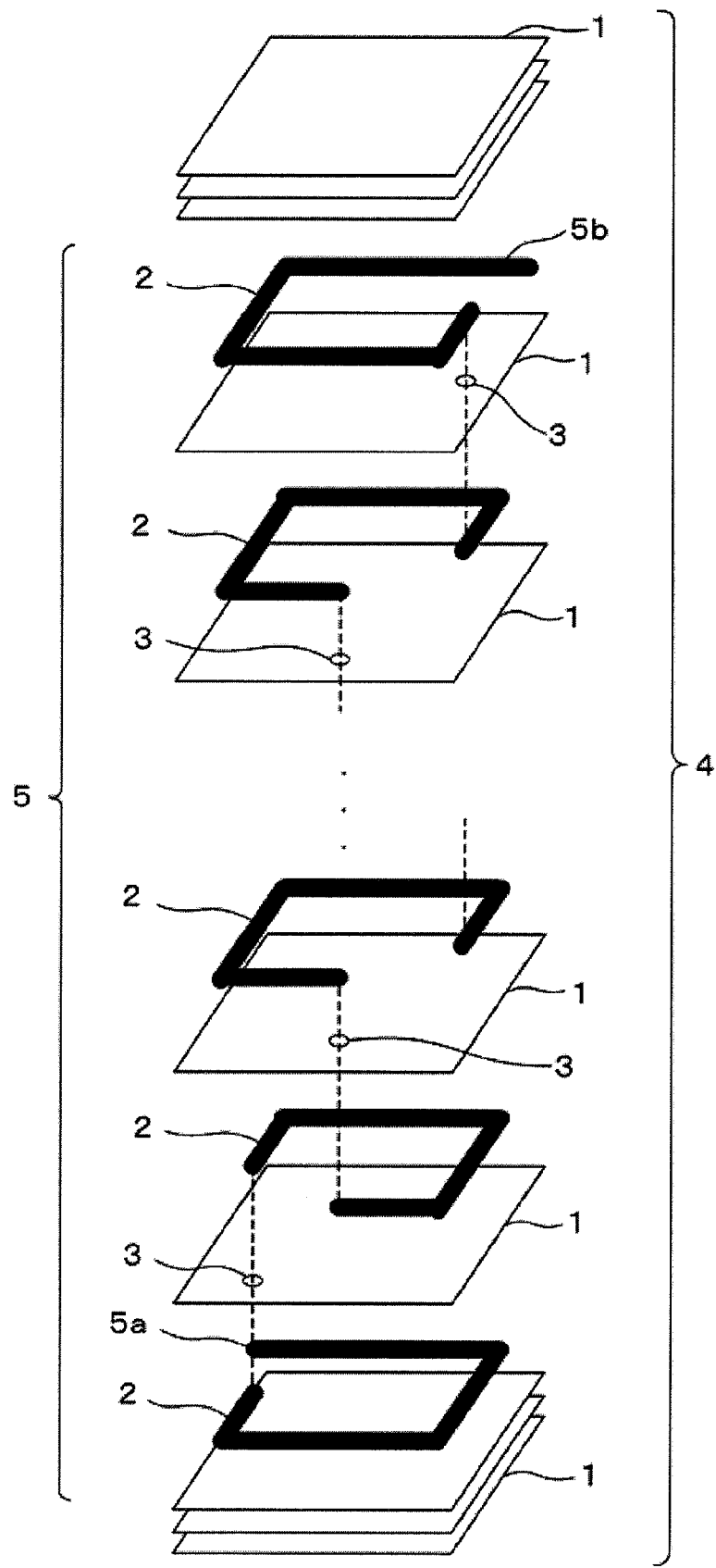
FIG. 2 is an exploded perspective view showing an internal structure of the multilayer wiring chip component (multilayer inductor) according to one embodiment of the present invention.

FIG. 1 is a perspective view showing an external structure of a multilayer wiring chip component (multilayer inductor) according to one embodiment of the present invention, and FIG. 2 is an exploded perspective view showing an internal structure thereof.

The multilayer wiring chip component of this Example 2 has the structure, as shown in FIGS. 1 and 2, in which conductor layers (internal conductors) 2 containing Ag as a primary component are laminated to each other with glass layers (insulating layers) 1 formed therebetween using the photosensitive glass paste of the present invention, and in which the conductor layers (internal conductors) 2 are connected to each other through via holes 3 (see FIG. 2) to form a spiral coil 5 in a laminate 4.

External electrodes 6a and 6b (FIG. 1) are provided on two end sides of the laminate 4 in the lateral direction so as to be connected to end portions 5a and 5b of the coil 5, and a direction mark pattern 7 (FIG. 1) is provided on an upper surface of the laminate 4 to indicate the directionality of the multilayer wiring chip component.

In this multilayer wiring chip component, although the conductor layers (internal conductors) 2 forming the coil 5 are disposed with the glass layers 1, which are the insulating layers, interposed therebetween, since the glass layers 1 are formed from the photosensitive glass paste of the present invention that can be fired at a low temperature for a short period of time, and that can suppress generation of voids and diffusion of Ag forming the conductor layers 2 in the glass layers formed by the firing, as described above, a highly reliable multilayer wiring chip component can be provided that has a small diffusion of the Ag conductive component and that includes insulating layers having superior sintering properties.

Next, a method for manufacturing this multilayer wiring chip component using the photosensitive glass paste of the present invention will be described.

(1) First, after a photosensitive glass paste (such as the photosensitive glass paste of Example 1 including the Inorganic Component 2 in Table 2 that uses the primary glass A and the sintering aid glass B) is screen-printed on a support member, such as PET film, and is then dried, an entire surface thereof is exposed. The above process is repeated several times, so that a glass layer having a predetermined thickness (such as approximately 150 μm) is formed as an external layer.

(2) Next, a photosensitive Ag paste is screen-printed on the external layer so as to have a thickness of approximately 10 μm, followed by drying. Subsequently, a photosensitive Ag paste layer is selectively processed by an exposure/development treatment to form a first-layer coil pattern.

(3) Furthermore, the photosensitive glass paste is screen-printed on the entire surface including the coil pattern thus formed so as to have a thickness of approximately 15 μm, followed by drying. Subsequently, a selective exposure/development treatment is performed to form via holes at predetermined positions.

(4) After the photosensitive Ag paste is again screen-printed on the entire surface to have a thickness of approximately 10 μm and is then dried, the photosensitive Ag paste is selectively processed by an exposure/development treatment to form a second-layer coil pattern.

(5) In addition, the photosensitive Ag paste layer (coil pattern) and photosensitive glass paste layer (insulating layer) are repeatedly laminated to each other until a necessary number of layers is obtained.

(6) the entire-surface printing of the photosensitive glass paste, drying, and entire-surface exposure are repeated a necessary number of times to form an external layer.

(7) Next, a direction mark pattern to indicate the directionality of the chip is screen-printed on the topmost layer of the external layer.

(8) After a mother laminate thus obtained is divided into chips using a dicer, the support member, such as a PET film, is separated, and debindering is performed, followed by firing.

(9) Subsequently, external electrodes are formed on the fired laminate. Furthermore, by an electrolytic plating method or an electroless plating method, for example, a plating layer having a monolayer or a multilayer structure is provided on the surface of each of the external electrodes.

Accordingly, a highly reliable multilayer wiring chip component (multilayer inductor) having the structure as shown in FIGS. 1 and 2 can be obtained that has a small Ag diffusion and that includes insulating layers having superior sintering properties.

In this Example 2, the case in which the multilayer wiring chip component is a multilayer inductor has been described by way of example; however, besides the multilayer inductor, the present invention may also be applied to various multilayer electronic components, such as a multilayer LC composite component, each having the structure in which glass layers and conductor layers are laminated to each other.

In addition, the present invention is not limited to the examples described above in terms of points other than those described above and, for example, the particular composition between the primary glass and the sintering aid glass, type of ceramic aggregate, composition ratios thereof, and type and composition ratio of photosensitive organic component may be variously changed and modified without departing from the spirit and scope of the present invention.

Industrial Applicability

According to the present invention described above, a photosensitive glass paste and a high-performance multilayer wiring chip component formed using the same can be provided, the photosensitive glass paste capable of being fired at a low temperature for a short period of time and of suppressing generation of voids and diffusion of Ag in glass layers formed by a firing step. Accordingly, the present invention may be widely applied to a field of multilayer wiring chip components, such as a multilayer inductor, each having the structure in which conductor layers are provided between glass layers, and to the field of photosensitive glass pastes used for manufacturing multilayer wiring chip components.

The invention claimed is:

1. A photosensitive glass paste adapted to form glass layers by firing when a multilayer wiring chip component is manufactured that includes the glass layers and at least one conductor layer formed between a pair of glass layers by firing a photosensitive Ag paste, the photosensitive glass paste comprising:

an inorganic component comprising a primary glass, a sintering aid glass, and a ceramic aggregate; and
a photosensitive organic component,
wherein the softening point of the sintering aid glass is 609° C. or more and the sintering glass has a content of $SiO_2$ of 45 to 60 percent by weight,
the content of the sintering aid glass in the inorganic component is 5 to 10 percent by volume, and
the contact angle of the sintering aid glass to the ceramic aggregate at 800° C. is smaller than that of the primary glass to the ceramic aggregate at 800° C.

2. The photosensitive glass paste according to claim 1, wherein the primary glass contains 70 to 90 percent by weight of $SiO_2$, 15 to 20 percent by weight of $B_2O_3$, and 1 to 5 percent by weight of $K_2O$.

3. The photosensitive glass paste according to claim 2, wherein the sintering aid glass contains in addition to the 45 to 60 percent by weight of $SiO_2$, 15 to 25 percent by weight of $B_2O_3$, 10 to 20 percent by weight of CaO, 5 to 15 percent by weight of $Li_2O$, and 0 to 10 percent by weight of ZnO.

4. The photosensitive glass paste according to claim 3, wherein the ceramic aggregate contains at least one member selected from the group consisting of alumina, magnesia, spinel, silica, forsterite, steatite, and zirconia, and the content of the ceramic aggregate in the inorganic component is 22.5 to 27.5 percent by volume.

5. The photosensitive glass paste according to claim 4, further comprising an organic dye as an ultraviolet absorber.

6. The photosensitive glass paste according to claim 5, further comprising a phosphorous-based compound as a photopolymerization initiator.

7. The photosensitive glass paste according to claim 6, wherein the phosphorous-based photopolymerization initiator is at least one member selected from the group consisting of bis(2,4,6-trimethylbenzoyl)-phenylphosphine oxide, 2,4,6-trimethylbenzoyl diphenylphosphine oxide, bis(2,6-dimethoxybenzoyl)-2,4,4-trimethylpentylphosphine oxide, bis(2,6-dichlorobenzoyl)-4-propylbenzylphosphine oxide, 2,4,6-trimethylbenzoyl diphenylphosphinate, and (2,6-dimethoxybenzoyl)-2,4,4-pentylphosphine oxide.

8. The photosensitive glass paste according to claim 1, wherein the sintering aid glass contains 45 to 60 percent by weight of $SiO_2$, 15 to 25 percent by weight of $B_2O_3$, 10 to 20 percent by weight of CaO, 5 to 15 percent by weight of $Li_2O$, and 0 to 10 percent by weight of ZnO.

9. The photosensitive glass paste according to claim 8, wherein the ceramic aggregate contains at least one member selected from the group consisting of alumina, magnesia, spinel, silica, forsterite, steatite, and zirconia, and the content of the ceramic aggregate in the inorganic component is 22.5 to 27.5 percent by volume.

10. The photosensitive glass paste according to claim 9, further comprising an organic dye as an ultraviolet absorber, or a phosphorous-based compound as a photopolymerization initiator, or both.

11. The photosensitive glass paste according to claim 10, wherein the phosphorous-based photopolymerization initiator is at least one member selected from the group consisting of bis(2,4,6-trimethylbenzoyl)-phenylphosphine oxide, 2,4,6-trimethylbenzoyl diphenylphosphine oxide, bis(2,6-dimethoxybenzoyl)-2,4,4-trimethylpentylphosphine oxide, bis(2,6-dichlorobenzoyl)-4-propylbenzylphosphine oxide, 2,4,6-trimethylbenzoyl diphenylphosphinate, and (2,6-dimethoxybenzoyl)-2,4,4-pentylphosphine oxide.

12. The photosensitive glass paste according to claim 1, wherein the ceramic aggregate contains at least one member selected from the group consisting of alumina, magnesia, spinel, silica, forsterite, steatite, and zirconia, and the content of the ceramic aggregate in the inorganic component is 22.5 to 27.5 percent by volume.

13. The photosensitive glass paste according to claim 1, further comprising an organic dye as an ultraviolet absorber.

14. The photosensitive glass paste according to claim 1, further comprising a phosphorous-based compound as a photopolymerization initiator.

15. The photosensitive glass paste according to claim 14, wherein the phosphorous-based photopolymerization initiator is at least one member selected from the group consisting of bis(2,4,6-trimethylbenzoyl)-phenylphosphine oxide, 2,4,6-trimethylbenzoyl diphenylphosphine oxide, bis(2,6-dimethoxybenzoyl)-2,4,4-trimethylpentylphosphine oxide, bis(2,6-dichlorobenzoyl)-4-propylbenzylphosphine oxide, 2,4,6-trimethylbenzoyl diphenylphosphinate, and (2,6-dimethoxybenzoyl)-2,4,4-pentylphosphine oxide.

16. A multilayer wiring chip component comprising a plurality of glass layers and a Ag conductor layer between a pair of adjacent glass layers, wherein
the glass layers are fired photosensitive glass paste according to claim 1, and
the Ag conductor layer is a heat treated photosensitive Ag paste.

17. A multilayer wiring chip component comprising a plurality of glass layers and a Ag conductor layer between a pair of adjacent glass layers, wherein
the glass layers are fired photosensitive glass paste according to claim 2, and
the Ag conductor layer is a heat treated photosensitive Ag paste.

18. A multilayer wiring chip component comprising a plurality of glass layers and a Ag conductor layer between a pair of adjacent glass layers, wherein
the glass layers are fired photosensitive glass paste according to claim 7, and
the Ag conductor layer is a heat treated photosensitive Ag paste.

19. A multilayer wiring chip component comprising a plurality of glass layers and a Ag conductor layer between a pair of adjacent glass layers, wherein
the glass layers are fired photosensitive glass paste according to claim 8, and
the Ag conductor layer is a heat treated photosensitive Ag paste.

20. A multilayer wiring chip component comprising a plurality of glass layers and a Ag conductor layer between a pair of adjacent glass layers, wherein
the glass layers are fired photosensitive glass paste according to claim 12, and
the Ag conductor layer is a heat treated photosensitive Ag paste.

* * * * *